(12) United States Patent
Su et al.

(10) Patent No.: US 10,522,652 B1
(45) Date of Patent: Dec. 31, 2019

(54) METHOD FOR FABRICATING SEMICONDUCTOR DEVICE WITH REDUCED WAFER EDGE DEFECTS

(71) Applicant: United Microelectronics Corp., Hsinchu (TW)

(72) Inventors: Po-Wen Su, Kaohsiung (TW); Chih-Wei Lin, Tainan (TW); Wei-Chih Lai, Kaohsiung (TW); Tai-Yen Lin, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/129,502

(22) Filed: Sep. 12, 2018

(30) Foreign Application Priority Data

Aug. 10, 2018 (CN) .......................... 2018 1 0908701

(51) Int. Cl.
| | |
|---|---|
| *H01L 21/8234* | (2006.01) |
| *H01L 21/3213* | (2006.01) |
| *H01L 21/306* | (2006.01) |
| *H01L 21/321* | (2006.01) |
| *H01L 29/66* | (2006.01) |
| *H01L 27/088* | (2006.01) |
| *H01L 21/033* | (2006.01) |
| *H01L 21/3105* | (2006.01) |

(52) U.S. Cl.
CPC .... *H01L 29/66545* (2013.01); *H01L 21/0337* (2013.01); *H01L 21/30625* (2013.01); *H01L 21/31053* (2013.01); *H01L 21/3212* (2013.01); *H01L 21/32134* (2013.01); *H01L 21/32139* (2013.01); *H01L 21/823437* (2013.01); *H01L 27/088* (2013.01)

(58) Field of Classification Search
CPC ......... H01L 21/26505; H01L 21/26513; H01L 21/2652; H01L 21/266; H01L 21/32115; H01L 21/3212; H01L 21/823437; H01L 29/4232; H01L 29/66477–66704; Y10S 438/959
See application file for complete search history.

(56) References Cited

U.S. PATENT DOCUMENTS

| | | | |
|---|---|---|---|
| 7,638,439 B2 | 12/2009 | Kubota et al. | |
| 8,530,326 B2* | 9/2013 | Lai | .................... H01L 21/31053 257/E21.54 |
| 8,658,483 B2 | 2/2014 | Hsu et al. | |
| 10,256,318 B2* | 4/2019 | Jeon | ................ H01L 21/823821 |

\* cited by examiner

*Primary Examiner* — Zandra V Smith
*Assistant Examiner* — Molly K Reida
(74) *Attorney, Agent, or Firm* — J. C. Patents

(57) ABSTRACT

A semiconductor device and a method for fabricating the same are provided. A structure of the semiconductor device includes a substrate having a device region and an edge region. A plurality of device structures is formed on the substrate. An etching stop layer is disposed in the edge region of the substrate. The etching stop layer is converted from P-type dopants from an exposed surface layer of the substrate.

9 Claims, 4 Drawing Sheets

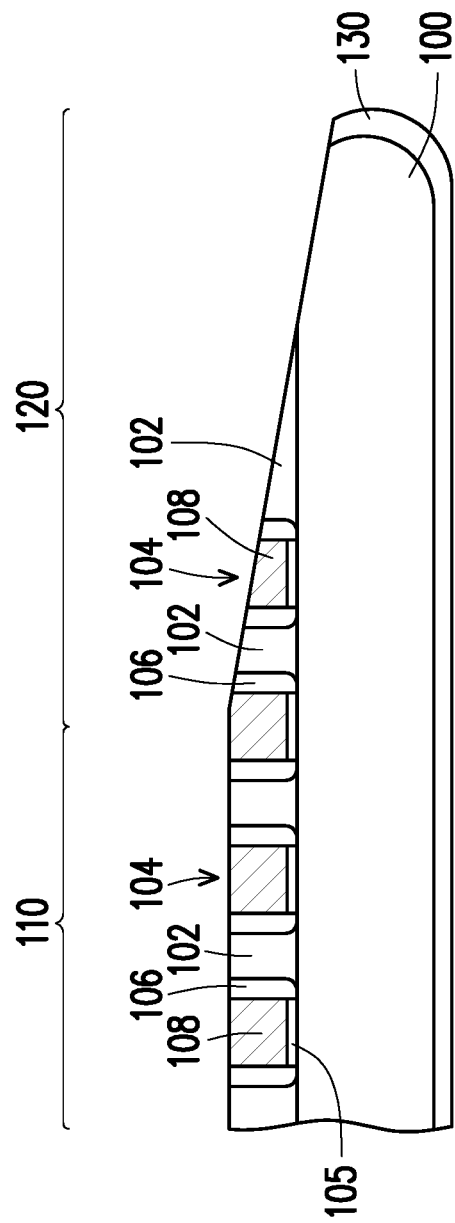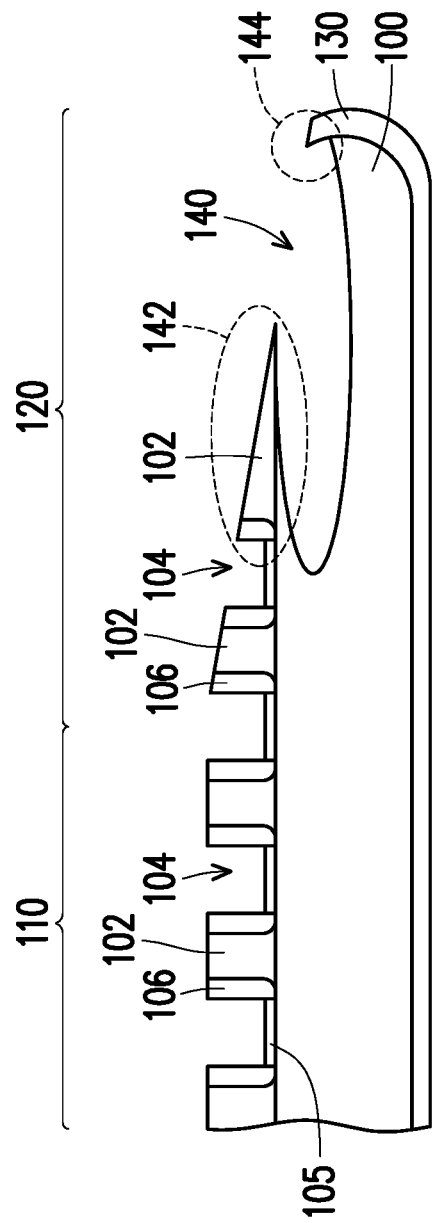

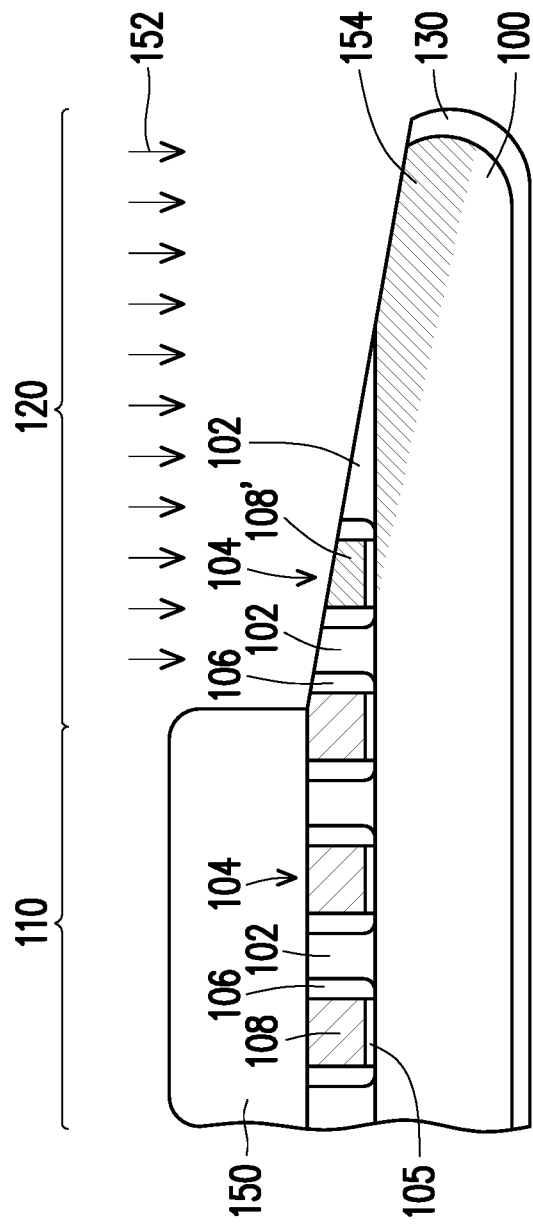
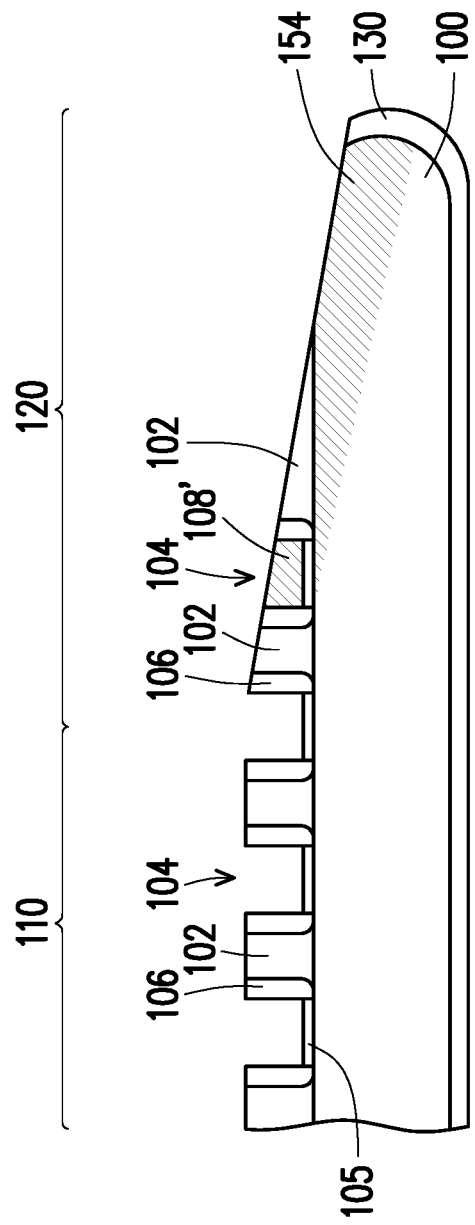

METHOD FOR FABRICATING SEMICONDUCTOR DEVICE WITH REDUCED WAFER EDGE DEFECTS

CROSS-REFERENCE TO RELATED APPLICATION

This application claims the priority benefit of China application serial no. 201810908701.3, filed on Aug. 10, 2018. The entirety of the above-mentioned patent application is hereby incorporated by reference herein and made a part of this specification.

BACKGROUND

Technical Field

The invention relates to a technique for fabricating a semiconductor. More particularly, the invention relates to a structure of a semiconductor device and a method for fabricating the same.

Description of Related Art

A transistor is a main device in an integrated circuit. Taking fabrication of transistor devices for example, in order to reduce the size and increase conductivity of the transistor devices, several designs for the structure of the transistor devices are correspondingly provided. A metal gate structure may be used to act as the gate structure so as to increase conductivity of the gate.

Taking a procedure for fabricating a metal gate structure for example, a dummy gate structure is required to be formed first, for instance, a gate of poly-silicon and a gate insulation layer are required to be completed first in the procedure. Besides, structures such as a spacer is required to be formed on the side wall as well. The dummy gate made of poly-silicon is then removed, and the space left is subsequently filled with a metal material to act as a metal gate.

In the above fabrication procedure, a polishing process is included so that a planarization surface is obtained and the dummy gate is exposed to facilitate subsequent removal of the dummy gate. Nevertheless, the device density of the edge region of the substrate is lower than the device density of the device region located in the middle of the substrate. As such, the edge region is to be excessively polished so that an inclined surface is formed. The silicon material of the substrate in the edge region is also exposed owning to excessive polishing caused by such polishing process. In this way, when the poly-silicon dummy gate is to be removed through the etching process, a portion of the substrate in the edge region may also be removed by the etching process, and the device may thereby be damaged.

In research and development of the fabrication technique, attention is required to be put on how to effectively and appropriately eliminate the foregoing problems.

SUMMARY

The invention provides a semiconductor device and a method for fabricating the same capable of reducing damages on a substrate in an edge region so that a structure in a device region may less likely to be affected as well.

In an embodiment of the invention, a structure of a semiconductor device includes a substrate having a device region and an edge region. A plurality of device structures are formed on the substrate. An etching stop layer is disposed in the edge region of the substrate. The etching stop layer is converted from an exposed surface layer of the substrate with P-type dopants.

In an embodiment of the invention, as to the structure of the semiconductor device, a device density of the edge region is less than a device density of the device region.

In an embodiment of the invention, as to the structure of the semiconductor device, top exposed surfaces of the device structures in the device region are dielectric insulation layers.

In an embodiment of the invention, as to the structure of the semiconductor device, the substrate is a single-side substrate or a double-side substrate.

In an embodiment of the invention, as to the structure of the semiconductor device, a dopant concentration of the P-type dopants in the edge region of the substrate is sufficient so that a silicon material of the substrate is converted into the etching stop layer.

In an embodiment of the invention, as to the structure of the semiconductor device, the P-type dopants are dopants containing boron.

In an embodiment of the invention, as to the structure of the semiconductor device, the edge region of the substrate is an inclined surface with respect to the device region, and a portion belonging to the substrate is exposed.

In an embodiment of the invention, as to the structure of the semiconductor device, the silicon material containing the P-type dopants remains, and the inclined surface is nearly an inclined plane.

In an embodiment of the invention, as to the structure of the semiconductor device, the inclined surface of the edge region includes the portion of the substrate and remaining portions of the device structures.

In an embodiment of the invention, as to the structure of the semiconductor device, the device structures are used to subsequently form metal gate structures.

In an embodiment of the invention, as to the structure of the semiconductor device, the device structures are semi-fabricated structures, and the silicon material contained in the device regions is to be removed subsequently.

In an embodiment of the invention, a method for fabricating a semiconductor device in an embodiment of the invention includes the following steps. A substrate having a device region and an edge region is provided. A plurality of device structures are formed on the substrate, and the device structures include silicon material. A mask layer is formed to expose the silicon material of the device structures in the edge region and a portion of the substrate. A P-type doping process is performed in the edge region, and the silicon material exposed in the edge region and a top region of the substrate are converted into materials of an etching stop layer. An etching process is performed to remove the silicon material, and the silicon material in the edge region is protected by the etching stop layer.

In an embodiment of the invention, as to the method for fabricating the semiconductor device, a device density of the edge region is less than a device density of the device region.

In an embodiment of the invention, as to the method for fabricating the semiconductor device, a polishing process is performed on the substrate before the P-type doping process is performed so as to at least expose the silicon material of the device structures. An inclined surface is formed in the edge region, and a portion belonging to the substrate is exposed.

In an embodiment of the invention, as to the method for fabricating the semiconductor device, the inclined surface formed after the polishing process is nearly an inclined plane.

In an embodiment of the invention, as to the method for fabricating the semiconductor device, the inclined surface of the edge region includes the portion of the substrate and remaining portions of the device structures.

In an embodiment of the invention, as to the method for fabricating the semiconductor device, the P-type doping process includes a dopant concentration so as to convert the silicon material of the substrate into the etching stop layer.

In an embodiment of the invention, as to the method for fabricating the semiconductor device, the P-type doping process is doping of dopants containing boron.

In an embodiment of the invention, as to the method for fabricating the semiconductor device, the device structures are used to subsequently form metal gate structures.

In an embodiment of the invention, as to the method for fabricating the semiconductor device, the device structures are semi-fabricated structures, and the silicon material contained in the device regions are required to be removed subsequently.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2 to FIG. 3 are schematic diagrams illustrating problems that are likely to occur when the semiconductor device provided by the invention is fabricated according to an embodiment of the invention.

FIG. 4 to FIG. 5 are schematic diagrams illustrating cross-sectional structures of the semiconductor device and a method for fabricating the semiconductor device according to an embodiment of the invention.

DESCRIPTION OF THE EMBODIMENTS

The invention relates to a technique for fabricating a semiconductor device. In a procedure for fabricating a semiconductor device, a polishing process may be performed in a device region to expose a dummy structure of a silicon material, so that the dummy structure can be removed through an etching process. In such procedure, the invention is capable of effectively preventing the substrate from being damaged at an edge region of the substrate.

Herein, several embodiments of the invention are introduced to further describe the invention; however, the invention is not limited by the embodiments.

Figure 1A:
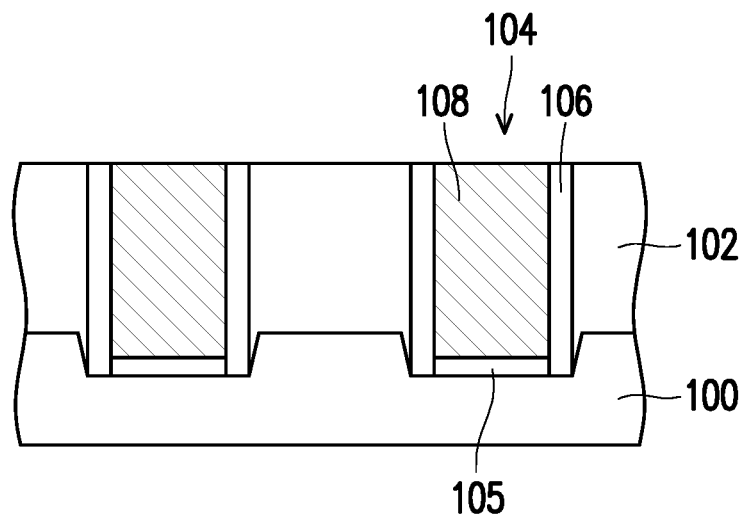
FIG. 1A to FIG. 1C are schematic diagrams of cross-sectional structures in part of a fabrication process flow of a semiconductor device provided by the invention according to an embodiment of the invention.
Figure 1B:
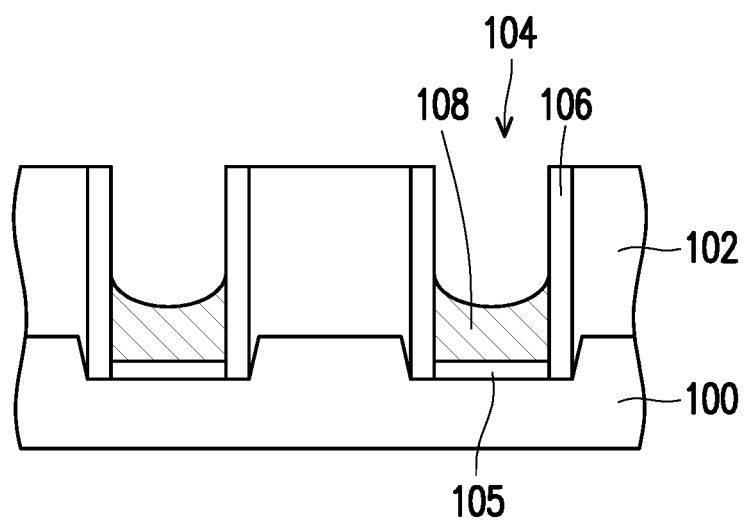
Figure 1C:
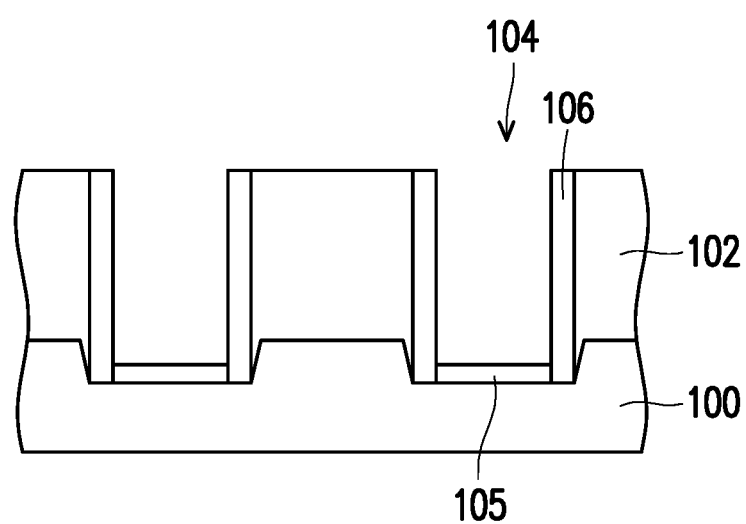

In this embodiment, fabrication of a transistor device is taken for example for description. FIG. 1A to FIG. 1C are schematic diagrams illustrating cross-sectional structures in part of a fabrication process flow of a semiconductor device provided by the invention according to an embodiment of the invention.

With reference to FIG. 1A, a fabrication process flow of a semiconductor device is exemplified as a fabrication process flow of a transistor device. According to the design of transistors, a transistor can generally be a transistor based on a planar substrate and can also be a fin field effect transistor (FinFET). A gate of a transistor may be designed to be, for example, a metal gate. That is, a substrate 100 provided by this embodiment is a planar substrate of a transistor and can also be a substrate of a fin field effect transistor and is a protruding fin line portion.

When a metal gate is fabricated, a dummy gate structure is required to be formed on the substrate 100 first and is represented by a device structure 104. The dummy gate structure, that is, the device structure 104, includes a gate 108 of poly-silicon. In addition, a dielectric insulation layer 105 below the gate 108 and a spacer 106 on a side wall of the gate 108 may also be formed. A periphery of the dummy gate structure, that is, a periphery of the device structure 104 is surrounded by an inner dielectric layer 102. A planarization surface is obtained through performing a polishing process, and that the gate 108 is exposed and may thereby be easily removed in the following process flow.

With reference to FIG. 1B, an etching process is performed to remove the dummy gate 108. A material of the gate 108 is, for example, poly-silicon, and a periphery of the gate 108 is made of a dielectric material. The gate 108 may be etched and a structure of the dielectric material may remain through selecting an appropriate etchant with a selection ratio for the etching process.

With reference to FIG. 1C, the poly-silicon gate 108 is eventually removed in the etching process, and a space left after the gate 108 is removed may be subsequently used to form a metal gate.

The above forming and removal of the dummy gate constitute part of the entire fabrication procedure of the metal gate. Nevertheless, if the substrate 100 is viewed from an entire wafer, the substrate 100 may be divided into a device region and an edge region. When looking into the edge region, the invention finds out that the device may be damaged from the edge region.

FIG. 2 to FIG. 3 are schematic diagrams illustrating problems that are likely to occur when the semiconductor device provided by the invention is fabricated according to an embodiment of the invention.

With reference to FIG. 2, in a general semiconductor device, device structures are formed on the substrate 100 according to different phases. The substrate 100 is generally a single-side substrate or a double-side substrate. In this embodiment, a double-side substrate is taking as an example, but is not limited thereto. The double-side substrate refers to a substrate of which some devices may also be formed on a back side of the substrate 100 in the subsequent fabrication procedure. In the current phase, fabrication is performed on a front side of the substrate 100, and the back side of the substrate 100 is surrounded by a protection dielectric layer 130.

The substrate 100 may be divided into a device region 110 and an edge region 120. Based on the shape of the wafer, the device region 110 refers to a middle region taking up most of an area of the wafer, and the edge region 120 refers to an annular region around the wafer.

The device region 110 is similar to the structure presented in FIG. 1A, and a plurality of device structures 104 are formed on the substrate 100. A dummy gate structure is taken as an example for describing each of the device structures 104, but the invention is not limited to the dummy gate structure. In this embodiment, each of the device structures 104, for example, includes a gate 108 of polysilicon and dielectric materials surrounding the gate 108 such as a spacer 106 and a dielectric insulation layer 105. Nevertheless, each of the device structures 104 of the invention is not limited to the dummy gate structure. That is, the gates 108 present poly-silicon structures, upper surfaces of the gates 108 are exposed, and peripheries of the structures are surrounded by the dielectric materials.

The polishing process is adopted, and in addition to the planarization surface which is required to be obtained in the device region 110, the upper surfaces of the gate 108 are also required to be exposed. The gates 108 are dummy structures and are required to be removed subsequently. Accordingly, since a device density of the edge region 120 is less than a device density of the device region 110, the edge region 120 may be polished and removed more easily when the substrate 110 is subjected to polishing performed in the polishing process. If the edge region 120 is excessively polished, besides the device structures in the edge region 120 which are excessively polished, the substrate 100 may also be excessively polished so that a silicon material of the substrate 100 is exposed. In other words, an inclined surface is formed in the edge region after the polishing process is performed, and the inclined surface is, for example, nearly a planar inclined surface. The inclined surface extends to an edge of the substrate 100. On the double-side substrate 100, the inclined surface extends to the protection dielectric layer 130.

With reference to FIG. 3, the gates 108 are dummy structures and thus are required to be removed. The etching process, for example, is performed to remove the structures. According to the invention, since the gates 108 and the substrate 100 are both made of silicon, when the gates 108 of the device structures 104 are removed through the etching process, a portion of the substrate 100 is removed at the same time from an exposed surface of the substrate 100, and a curved recess 140 is thereby formed. The recess 140 may extend below the device structures 104 belonging to the edge region 120, and the underlying silicon material is thereby hollowed out, and that a suspended structure 140 is structurally formed. In addition, in an embodiment where the double-side substrate 100 is adopted, an inward arc-shaped structure 144 may also be formed by the recess 140 on the protection dielectric layer 130.

The suspended structure 142 may be broken easily owing to insufficient mechanical strength, so that the device structures 104 in the device region 110 may be affected. In addition, since the arc-shaped structure 144 of the protection dielectric layer 130 is an inward curved surface, when substances are subsequently deposited, the substances may be easily sputtered to the device structures 104 in the device region 110, as such, the devices are polluted.

Possible fabrication flaws in the fabrication process flow as described above are observed by the invention. Suitable corrections are provided by the invention according to mechanisms of which the flaws occur.

FIG. 4 to FIG. 5 are schematic diagrams illustrating cross-sectional structures of the semiconductor device and a method for fabricating the semiconductor device according to an embodiment of the invention.

With reference to FIG. 4, following the state shown in FIG. 2, a mask layer 150 is formed first. The mask layer 150, for example, is a photoresist layer of a photolithography etching process, covers the device region 110, and exposes the edge region 120. The edge region 120 may still include some device structures 104 and includes mainly the inner dielectric layers 102 and the substrate 110. In an embodiment of the invention, after the mask layer 150 covering the device region 110 and exposing the edge region 120 is formed, the mask layer 150 is served as a mask in an implanting process 152 to dope P-type dopants to a top surface layer of the substrate 100 in the edge region 120. Simultaneously, the silicon material in the device structures 104 in the edge region 120, for example, the poly-silicon gates 108 may also be doped into doping gates 108'.

In this way, a silicon material of a surface layer of the edge region 120 is converted into an etching stop layer 154 relative to silicon owing to the P-type dopants. The doping gates 108' act as a portion of the etching stop layer 154 as well. The P-type dopants are, for example, dopants containing boron. According to research data on material characteristics, when silicon is exemplified as being etched by a KOH etchant or a $NH_4OH$ etchant, after silicon is doped by boron dopants and a concentration of boron reaches a certain level, an etching rate is evidently lowered. Therefore, the P-type dopants of an appropriate concentration are doped to a silicon material on a surface layer of the substrate 110 by the implanting process 152, such that the P-type dopants can be converted into the etching stop layer 154 relative to silicon by the implanting process.

With reference to FIG. 5, after the mask layer 150 is removed, the etching process on the silicon material can be performed, so as to remove the gates 108 in the device region 110. The invention is not limited to removal of the dummy gates. In general, when exposed silicon material exists in the device structures 104 in the device region 110 and are required to be removed, the etching stop layer can thereby be formed in the edge region through the technique provided by the invention.

Since the etching stop layer 154 is formed in the edge region 120, even if the inclined surface is formed in the edge region 120 owing to the polishing process, the etching stop layer 154 prevents the substrate 100 from being etched in the edge region 120, and the flaw shown in FIG. 3 is thus prevented from being generated.

In FIG. 5, after the etching process is completed, spaces left after the gates 108 are removed may subsequently be filled with metal, so as to continue and complete fabrication of metal gate structures. The invention is not intended to limit other subsequent fabrication process flows.

In view of the foregoing, the P-type dopants are allowed to reach a sufficient concentration in the edge region 120 in the invention, and the silicon material converted into the substrate acts as the etching stop layer. In this way, the substrate 100 is prevented from being etched in the edge region 120. Further, the suspended structure 142 and the arc-shaped structure 144 as shown in FIG. 3 are also prevented from being generated in the edge region 120.

Finally, it is worth noting that the foregoing embodiments are merely described to illustrate the technical means of the invention and should not be construed as limitations of the invention. Even though the foregoing embodiments are referenced to provide detailed description of the invention, people having ordinary skill in the art should understand that various modifications and variations can be made to the technical means in the disclosed embodiments, or equivalent replacements may be made for part or all of the technical features; nevertheless, it is intended that the modifications, variations, and replacements shall not make the nature of the technical means to depart from the scope of the technical means of the embodiments of the invention.

What is claimed is:

1. A method for fabricating a semiconductor device, comprising:

providing a substrate having a device region and an edge region;

forming a plurality of device structures on the substrate, wherein the device structures comprise a silicon material;

forming a mask layer, exposing the silicon material of the device structures in the edge region and a portion of the substrate;

performing a P-type doping process in the edge region, converting the silicon material exposed in the edge region and a top region of the substrate into materials of an etching stop layer; and performing an etching process to remove the silicon material, wherein the silicon material in the edge region is protected by the etching stop layer.

2. The method for fabricating the semiconductor device as claimed in claim 1, wherein a device density of the edge region is less than a device density of the device region.

3. The method for fabricating the semiconductor device as claimed in claim 1, further comprising performing a polishing process on the substrate before performing the P-type doping process so as to at least expose the silicon material of the device structures, wherein an inclined surface is formed in the edge region, and a portion belonging to the substrate is exposed.

4. The method for fabricating the semiconductor device as claimed in claim 3, wherein the inclined surface formed after the polishing process is nearly an inclined plane.

5. The method for fabricating the semiconductor device as claimed in claim 3, wherein the inclined surface of the edge region comprises the portion of the substrate and remaining portions of the device structures.

6. The method for fabricating the semiconductor device as claimed in claim 1, wherein the P-type doping process comprises a dopant concentration so as to convert the silicon material of the substrate into the etching stop layer.

7. The method for fabricating the semiconductor device as claimed in claim 1, wherein the P-type doping process is doping of dopants containing boron.

8. The method for fabricating the semiconductor device as claimed in claim 1, wherein the device structures are used to subsequently form metal gate structures.

9. The method for fabricating the semiconductor device as claimed in claim 1, wherein the device structures are semi-fabricated structures, and the silicon material contained in the device regions is to be removed subsequently.

* * * * *